(12) United States Patent
Lindsey et al.

(10) Patent No.: US 7,714,587 B2
(45) Date of Patent: May 11, 2010

(54) SYSTEMS AND METHODS FOR DETECTING A FAULTY GROUND STRAP CONNECTION

(75) Inventors: Robert Wayne Lindsey, Washington, IL (US); Dustin Craig Selvey, Peoria, IL (US); Arthur Wild, Chillicothe, IL (US); Robert Roy Sychra, Washington, IL (US)

(73) Assignee: Caterpillar Inc., Peoria, IL (US)

( * ) Notice: Subject to any disclaimer, the term of this patent is extended or adjusted under 35 U.S.C. 154(b) by 194 days.

(21) Appl. No.: 11/819,885

(22) Filed: Jun. 29, 2007

(65) Prior Publication Data

US 2009/0001993 A1    Jan. 1, 2009

(51) Int. Cl.
G01R 31/14  (2006.01)
H02H 3/00   (2006.01)

(52) U.S. Cl. .................. 324/509; 324/511; 361/42

(58) Field of Classification Search ......... 324/509–511; 361/42

See application file for complete search history.

(56) References Cited

U.S. PATENT DOCUMENTS

| | | | |
|---|---|---|---|
| 3,727,106 A * | 4/1973 | Mendel et al. ............... 361/48 |
| 4,709,164 A * | 11/1987 | Giesl ....................... 307/326 |
| 6,678,132 B1 | 1/2004 | Carruthers et al. |
| 6,700,384 B2 | 3/2004 | Yugou |
| 6,958,642 B2 | 10/2005 | Johnson et al. |
| 6,970,807 B2 | 11/2005 | Kito et al. |
| 6,977,518 B2 | 12/2005 | Higashihama et al. |
| 6,992,490 B2 | 1/2006 | Nomoto et al. |
| 7,030,623 B1 | 4/2006 | Carpenter |
| 7,102,356 B2 | 9/2006 | Wild |
| 2001/0052777 A1 | 12/2001 | Belau et al. |
| 2004/0004481 A1 | 1/2004 | Jin |
| 2004/0130326 A1 | 7/2004 | Yamamoto |
| 2005/0146335 A1 | 7/2005 | Wild |
| 2006/0006840 A1 | 1/2006 | Furukawa |
| 2006/0114000 A1 | 6/2006 | Scholl et al. |

* cited by examiner

*Primary Examiner*—Timothy J Dole
(74) *Attorney, Agent, or Firm*—Finnegan, Henderson, Farabow, Garrett & Dunner; Bill Beckman

(57) ABSTRACT

Systems and methods are disclosed for detecting a faulty ground strap connection for a machine hosting a high voltage system. In one embodiment, a fault detection and compensation system includes a ground strap, a DC power supply electrically referenced to a machine frame, a leakage detection switch connected to the machine frame, a current source controlled by the leakage detection switch, and a voltage measuring device that measures an offset voltage. The fault detection and compensation system further includes a leakage detection and compensation controller that compensates for the unbalanced fault condition by controlling the leakage detection switch and the current source, and determines whether the ground strap is properly connected to the machine frame.

20 Claims, 3 Drawing Sheets

SYSTEMS AND METHODS FOR DETECTING A FAULTY GROUND STRAP CONNECTION

TECHNICAL FIELD

This disclosure relates generally to electrical leakage detection and compensation systems, and more particularly, to an electrical leakage detection and compensation system for compensating for unbalanced leakage currents and detecting balanced leakage currents in high voltage direct current (HVDC) systems used in machines.

BACKGROUND

An HVDC power supply system is required for driving an electric machine that incorporates a high voltage electrical drive motor and electric auxiliaries. The integrity of the high voltage system is critical to the reliability and integrity of the machine. Typically, the machine frame is electrically insulated from the terminals or conductors of the high voltage power supply.

Under normal working conditions, DC leakage currents on the order of microamps exist between the conductors of the high voltage power supply and the machine frame. Thus, the leakage resistances between the conductors of the high voltage power supply and the frame are normally very high. However, under faulty conditions (e.g., insulation failure), electric currents from a high voltage power supply may leak to a machine frame. Such leakage currents, when significant, may be an indication of machine component fatigue or failure of a conductor's insulation. In order to ensure the proper operating conditions and the integrity of the machines, it is necessary to detect electrical leakage between the conductors of the high voltage power supply and the machine frame.

Further, the configuration of certain high voltage systems requires that the high voltage and low voltage conductors of the high voltage power supply are balanced in reference to the machine frame. For example, the conductors of a high voltage power supply in the system may be +100V and −100V when referenced to the machine frame. For this type of high voltage system configuration, it is desirable to compensate for unbalanced electrical leakage currents so that the system will stay balanced and centered in reference to the machine frame.

Conventional systems and methods have been implemented to detect electrical leakage. For example, U.S. Pat. No. 6,700,384 to Yugou (the '384 patent) discloses a power source device having a cell unit comprising a plurality of cells. In the '384 patent, a first current line having two voltage dividing resistors interposed therebetween is connected between a positive side terminal and a negative side terminal of the cell unit. A second current line having two protection resistors and two detection resistors interposed therebetween is also connected between a positive side terminal and a negative side terminal of the cell unit. An intermediate point of the second line is grounded via an insulation resistor. The voltage difference between a voltage ($V_1$, $V_2$) detected by the detection resistors and a reference voltage ($V_c$) obtained from a point of connection between the voltage dividing resistors is provided as the input to two Op-Amps serving as the input voltage ($V_{1IN}$, $V_{2IN}$). Based on the output voltage ($V_{1OUT}$, $V_{2OUT}$) obtained from the Op-Amps, leakage occurrence is detected.

While prior art systems, such as the '384 patent, may detect electrical leakage, they do not detect electrical leakage in a balanced fault condition. The disclosed embodiments improve upon these prior art systems by, in one embodiment, providing a compensation mechanism that automatically compensates for electrical leakage in a circuit so that the circuit stays balanced in reference to the machine frame. The disclosed embodiments further improve upon prior art systems by, in another embodiment, providing a leakage detection mechanism that detects electrical leakage in a circuit with balanced leakage resistance. Additionally, the disclosed embodiments improve upon the prior art systems by providing a faulty connection detection mechanism that can be used to detect a faulty ground strap connection in a machine.

SUMMARY OF THE INVENTION

Systems and methods are disclosed for detecting a faulty ground strap connection for a machine hosting a high voltage system. In one embodiment, a fault detection and compensation system includes a ground strap, a DC power supply electrically referenced to a machine frame, a leakage detection switch connected to the machine frame, a current source controlled by the leakage detection switch, and a voltage measuring device that measures an offset voltage. The fault detection and compensation system further includes a leakage detection and compensation controller that compensates for the unbalanced fault condition by controlling the leakage detection switch and the current source, and determines whether the ground strap is properly connected to the machine frame.

BRIEF DESCRIPTION OF THE DRAWINGS

The accompanying drawings, which are incorporated in and constitute a part of this specification, illustrate exemplary embodiments and, together with the description, serve to explain these disclosed embodiments. In the drawings.

DETAILED DESCRIPTION

Figure 1:
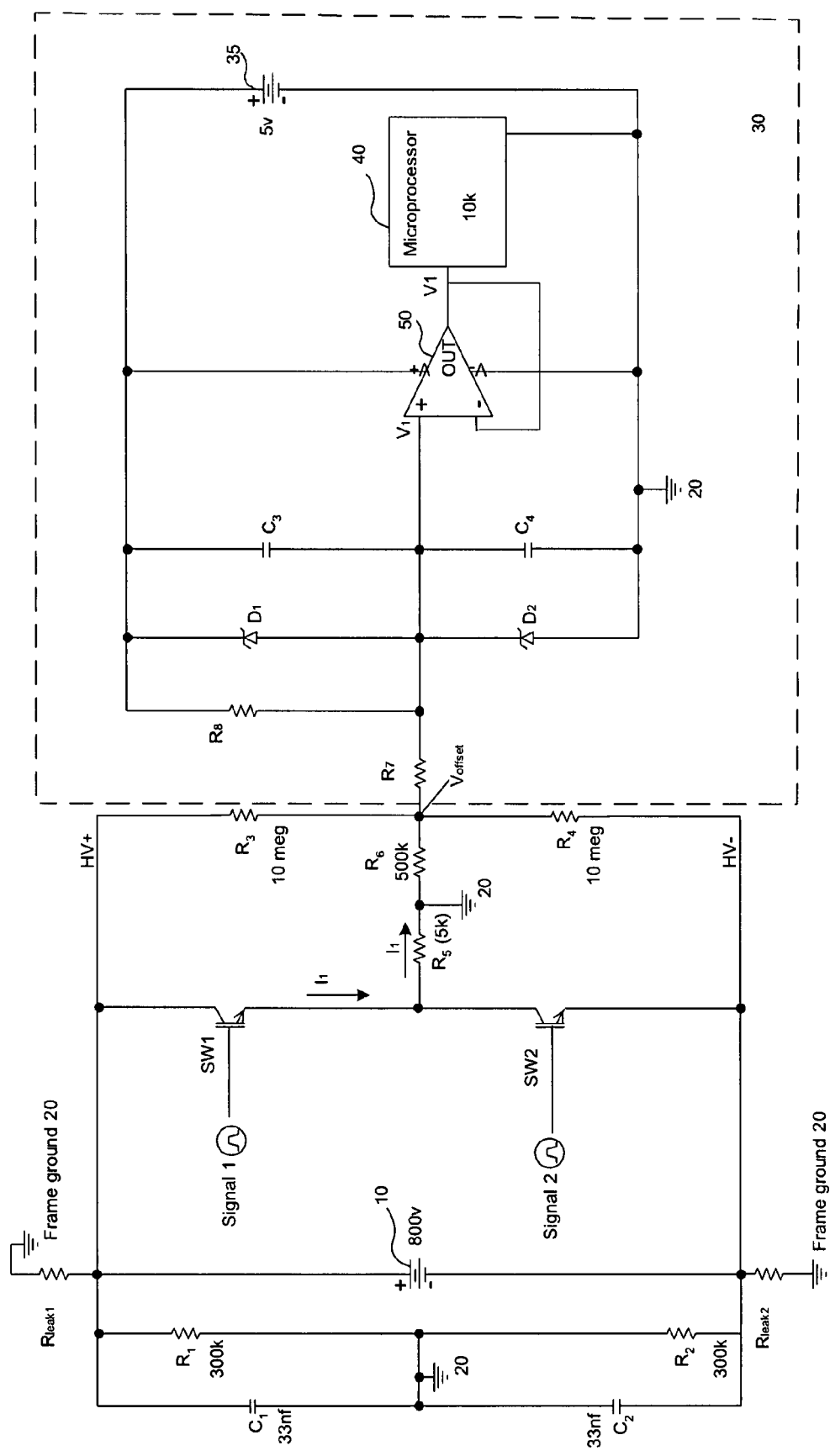
FIG. 1 is an exemplary electrical leakage detection and compensation circuit consistent with the disclosed embodiments.

Reference will now be made in detail to the disclosed embodiments, examples of which are illustrated in the accompanying drawings. Wherever possible, the same reference numbers will be used in the drawings to refer to the same or like parts.

In the disclosed embodiments, a machine may refer to a petroleum-electric hybrid powered machine, such as a hybrid-electric vehicle which uses an internal combustion engine and electric batteries, fuel cells, or other electrical power sources to power electric motors. A machine may also refer to any type of machine, such as an electric vehicle, with one or more electric motors and an electric power source. A frame may refer to the conductive support structure or housing of the machine including an electrical power source.

FIG. 1 illustrates an exemplary electrical leakage detection and compensation circuit 100 consistent with the disclosed embodiments. Electrical leakage detection and compensation circuit 100 may be used to compensate for electrical leakage currents, and to detect the presence of an electrical leakage current between a terminal of a DC power supply and the frame of a machine.

HVDC power supply 10 may be a generator, a battery, or any other suitable power source. In one embodiment, HVDC power supply 10 may be a high voltage DC power supply, such as an 800 volt DC power supply. The frame of the machine including the power supply may be referred to as frame ground Positive voltage bus HV+ is connected to the positive terminal of HVDC power supply 10. Negative voltage bus HV− is connected to the negative terminal of HVDC power supply 10. The positive and negative voltage buses (HV+ and HV−) are resistively referenced to frame ground 20 by resistors $R_1$ and $R_2$. When circuit 100 is balanced (e.g., in a balanced condition), the positive and negative voltage buses (HV+ and HV−) are centered equally around frame ground 20. When circuit 100 is unbalanced (or in an unbalanced condition), the positive and negative voltage buses (HV+ and HV−) are not centered around frame ground 20.

Electrical leakage detection and compensation circuit 100 may also include one or more independent power supplies for supplying power to some of the circuit components. For example, a low voltage DC power supply may be a DC power supply that supplies voltage lower than that supplied by HVDC power supply 10, such as a 5-V DC power supply 35, which supplies power to a microprocessor 40 and an operational amplifier (Op-Amp) 50.

Electrical leakage detection and compensation circuit 100 may further include a number of resistors and capacitors. $R_1$ and $R_2$ are two resistors of equal resistance that balance and reference the positive and negative voltage buses (HV+ and HV−) equally around frame ground 20. $C_1$ and $C_2$ are two capacitors of equal capacitance also used to balance and reference the voltage buses (HV+ and HV−) equally around frame ground 20. Resistors $R_3$ and $R_4$ are two resistors of equal resistance. $R_3$ and $R_4$ are connected to frame ground 20 through resistor $R_6$. Resistors $R_3$, $R_4$, and $R_6$ form a voltage divider between the voltage buses (HV+ and HV−) and frame ground 20.

The leakage resistance between positive voltage bus HV+ and frame ground 20 is shown in FIG. 1 as a leakage resistance $R_{leak1}$. The leakage resistance between negative voltage bus HV− and frame ground 20 is shown as a leakage resistance $R_{leak2}$. Under normal conditions (e.g., when the machine has no electrical fault), the leakage resistance (i.e., $R_{leak1}$ and $R_{leak2}$) may be relatively high (e.g., greater than 10MΩ). Under faulty conditions (e.g., when there is an insulation breakdown), the leakage resistance ($R_{leak1}$ and $R_{leak2}$) may be unacceptably low (e.g., 100 kΩ). The range of acceptable leakage resistance values may be determined based on the type of voltage power supply, the type of machine hosting the voltage power supply, and/or the components in the machine's circuits, etc. (e.g., capacitors, resistors, etc.)

In order to detect leakage resistance ($R_{leak1}$ and $R_{leak2}$) and compensate for leakage currents (e.g., current that flows through $R_{leak1}$ and $R_{leak2}$), electrical leakage detection and compensation circuit 100 may include a leakage detection and compensation control system. Such a control system may include one or more software and/or hardware components that may be implemented to detect and compensate electrical leakage in one or more circuits, such as circuit 100. The leakage detection and compensation control system may be implemented within the machine hosting circuit 100. Alternatively, the leakage detection and compensation control system may be remote to the machine hosting circuit 100, and communicate with the machine and circuit 100 through a wireless or wireline communication network.

In one embodiment, the leakage detection and compensation control system may be a leakage detection and compensation controller 30 (as shown in FIG. 1). Leakage detection and compensation controller 30 may be configured to detect the presence of an undesired electrical leakage current (i.e., an unacceptably low leakage resistance) between a terminal of an HVDC power supply 10 and the frame ground 20 of the machine containing HVDC power supply 10. Leakage detection and compensation controller 30 may be further configured to compensate for electrical leakage currents to ensure that circuit 100 is balanced in reference to frame ground 20. Leakage detection and compensation controller 30 may further include operational amplifier 50 and microprocessor 40 (e.g., PIC 16F767 by Microchip Technology Inc.®).

Leakage detection and compensation controller 30 may include one or more devices that measure voltage and/or current in a circuit. For example, a voltage measuring device may be configured to measure $V_{offset}$ in circuit 100. In one embodiment, leakage detection and compensation controller 30 may include resistors $R_7$ and $R_8$. Resistors $R_7$ and $R_8$ form a voltage divider. The voltage divider is used to ensure that the input voltage $V_1$ provided to Op-Amp 50 is at equilibrium at a value of 2.5 V. Leakage detection and compensation controller 30 may also include diodes $D_1$ and $D_2$ that prevent the voltage across capacitors $C_3$ and $C_4$ from rising above a specified voltage (e.g., 5 V). This may prevent damage to microprocessor 40. Capacitors $C_3$ and $C_4$ may be used to stabilize the inputs to Op-Amp 50.

Op-Amp 50 may be used as a buffer amplifier to eliminate loading effects and to interface impedances (e.g., connecting a device with a high source impedance to a device with a low input impedance). $V_1$ refers to the input voltage to Op-Amp 50. $V_1$ may have a linear relationship to $V_{offset}$, and as such, may reflect the value of $V_{offset}$. Op-Amp 50 outputs $V_1$ to microprocessor 40.

Microprocessor 40 is configured to perform calculations that determine circuit unbalance, leakage resistances, leakage currents, etc. For example, microprocessor 40 may compare input voltage $V_1$ to a predetermined value and determine whether to inject current into circuit 100. Further, microprocessor 40 may be configured to control transistor switches SW1 and SW2 based on the determination. Additionally, leakage detection and compensation controller 30 may provide data to other systems for further processing.

In one embodiment, a transistor may be used to implement switches SW1 and SW2, as shown in FIG. 1. A transistor switch may be, for example, an insulated gate bipolar transistor (IGBT) and is turned ON and OFF by a control signal, such as control signal 1. Signal 1 and signal 2 may be an ON-OFF control signal generated by leakage detection and compensation controller 30 (e.g., controlled by microprocessor 40). Leakage detection and compensation controller 30 may generate signals of predetermined or varying values (e.g., DC voltage levels, pulse width modulated signals, etc.). In one embodiment, as shown in FIG. 1, transistor switch SW1 is connected to the positive voltage bus HV+ and balance resistor $R_5$, which is connected to frame ground 20. $R_5$ is a resistor used to establish a current path between transistor switches SW1 or SW2 and frame ground 20. Transistor switches SW1 and SW2 may also be used as a current source that injects current at predetermined levels for one or more predetermined time intervals into circuit 100.

For example, microprocessor 40 may control signal 1 to provide a positive voltage (e.g., a voltage of a predetermined positive level) to the gate of transistor switch SW1. Transistor switch SW1 is then placed in an ON (i.e., conducting) condition. This causes resistor $R_5$ to be connected between transistor switch SW1 and frame ground 20. In this "ON" condition, microprocessor 40 may use signal 1 to inject a known current (i.e., switching on a current source) into frame ground 20 through resistor $R_5$.

When signal 1 does not provide sufficient positive voltage (e.g., a voltage below the threshold level) to the gate of transistor switch SW1 or SW2, transistor switches SW1 and SW2 are OFF (i.e., nonconducting). In this "OFF" condition, resistor $R_5$ is disconnected from frame ground 20, and resistors $R_1$, $(R_3+R_6)$, $R_{leak1}$, and capacitor $C_1$ form a parallel configuration between the positive voltage bus HV+ and frame ground 20.

As shown in FIG. 1, in one embodiment, the HVDC power supply 10 is a 800 volt DC power supply, although other types of power supplies may also be implemented consistent with the disclosed embodiments. In FIG. 1, $R_1$ and $R_2$ are two resistors of 300 kΩ. $R_3$ and $R_4$ are resistors of 10MΩ. $R_6$ is a resistor of 500 kΩ. $C_1$ and $C_2$ are two capacitors of 33 nF. The values of resistors $R_1$-$R_4$ and $R_6$, and capacitors $C_1$ and $C_2$, as shown in FIG. 1, are exemplary, and the components of circuit 100 may be of other values.

In FIG. 1, resistors $R_1$-$R_4$ and $R_6$, and capacitors $C_1$ and $C_2$ are evenly distributed between the positive voltage bus HV+, frame ground 20, and the negative voltage bus HV− ($R_1$=$R_2$, $R_3$=$R_4$, and $C_1$=$C_2$). When the resistance of $R_{leak1}$ equals the resistance of $R_{leak2}$, the leakage resistance is also evenly distributed between the positive voltage bus HV+, frame ground 20, and the negative voltage bus HV−. In this case, circuit 100 is considered to be in a balanced fault condition. Conversely, when the resistance of $R_{leak1}$ does not equal that of $R_{leak2}$, circuit 100 is considered to be in an unbalanced fault condition.

When circuit 100 is unbalanced, the voltage across positive voltage bus HV+ and frame ground 20 does not equal the voltage across the frame ground 20 and the negative voltage bus HV−. The circuit unbalance may be presented as a function of the positive and negative voltages (i.e., HV+ and HV−). In one embodiment, the ground fault detection (GFD) unbalance (percentage) of circuit 100 may be defined as:

$$GFD\ \text{Unbalance} = 1 - \left|\frac{HV-}{\frac{HVDC}{2}}\right| \quad (1)$$

where HVDC=(HV+)−(HV−).

To determine the GFD unbalance (voltage) of circuit 100, leakage detection and compensation controller 30 may first measure $V_{offset}$. $V_{offset}$ refers to the voltage measurement across the resistor $R_6$. Because resistors $R_3$, $R_4$, and $R_6$ form a voltage divider, $V_{offset}$ can be calculated based on the following equation.

$$V_{offset} = \frac{\left(\frac{HV-}{R_4} + \frac{HV+}{R_3}\right)}{(1/R_3)+(1/R_4)+(1/R_6)} \quad (2)$$

Because HVDC=(HV+)−(HV−) and HVDC is the known voltage of HVDC power supply 10, for circuit 100, leakage detection and compensation controller 30 may also determine the magnitude of an unbalanced condition (voltage) without knowing the specific values of HV+ or HV− by applying the following equation:

$$HV_{unbalance} = V_{offset} \times ((R_3 \| R_4) + R_6)/R_6 \quad (3)$$

where $((R_3\|R_4)+R_6)/R_6$ is the divider ratio. For example, in FIG. 1, the divider ratio $((R_3\|R_4)+R_6)/R_6$=11. Leakage detection and compensation controller 30 may determine the voltage unbalance of circuit 100, as defined by equation 3, by measuring $V_{offset}$.

Under normal conditions with no leakage currents, $R_{leak1}$ and $R_{leak2}$ are of relative large values in circuit 100, and HV+=|HV−|. The measurement of $V_{offset}$ would be 0 V. $HV_{unbalance}$ would also be 0 (equation 3). Leakage detection and compensation controller 30 may therefore determine that circuit 100 is in a balanced condition with no fault.

When the resistance of $R_{leak1}$ does not equal that of $R_{leak2}$, and the leakage resistances are unacceptably low values (i.e., the leakage current in the circuit is significant), circuit 100 is considered to be in an unbalanced fault condition. When circuit 100 is in an unbalanced fault condition, HV+≠|HV−|. As such, leakage detection and compensation controller 30 may measure $V_{offset}$, and then use $V_{offset}$ to calculate the $HV_{unbalance}$ as defined in equation 3. Further, leakage detection and compensation controller 30 may decide to balance circuit 100 by injecting a current into circuit 100 using transistor switches SW1 or SW2

When the resistance of $R_{leak1}$ equals that of $R_{leak2}$, and the leakage resistances are unacceptably low values, circuit 100 is in a balanced fault condition. Under such balanced faulty conditions HV+=|HV−|, therefore, $V_{offset}$=0 V (see equation 2). As such, measurements of $V_{offset}$ may show that the circuit 100 is balanced. To detect the electrical leakage under a balanced fault condition, leakage detection and compensation controller 30 may inject a known current into circuit 100 using transistor switches SW1 or SW2.

As discussed above, when there is electrical leakage in circuit 100, leakage detection and compensation controller 30 may be configured to first detect whether circuit 100 is in a balanced condition. If circuit 100 is unbalanced ($V_{offset}$≠0 V), leakage detection and compensation controller 30 may calculate the $HV_{unbalance}$ and turn on transistor switches SW1 or SW2 to balance circuit 100. If circuit 100 is balanced ($V_{offset}$=0 V), leakage detection and compensation controller 30 may then turn on transistor switches SW1 or SW2 for one or more specific time intervals to detect the existence of undesired balanced electrical leakage paths between negative and positive voltage buses (i.e., HV− and HV+) and frame ground 20. This leakage compensation and detection process is further described in connection with FIG. 2.

Figure 2:
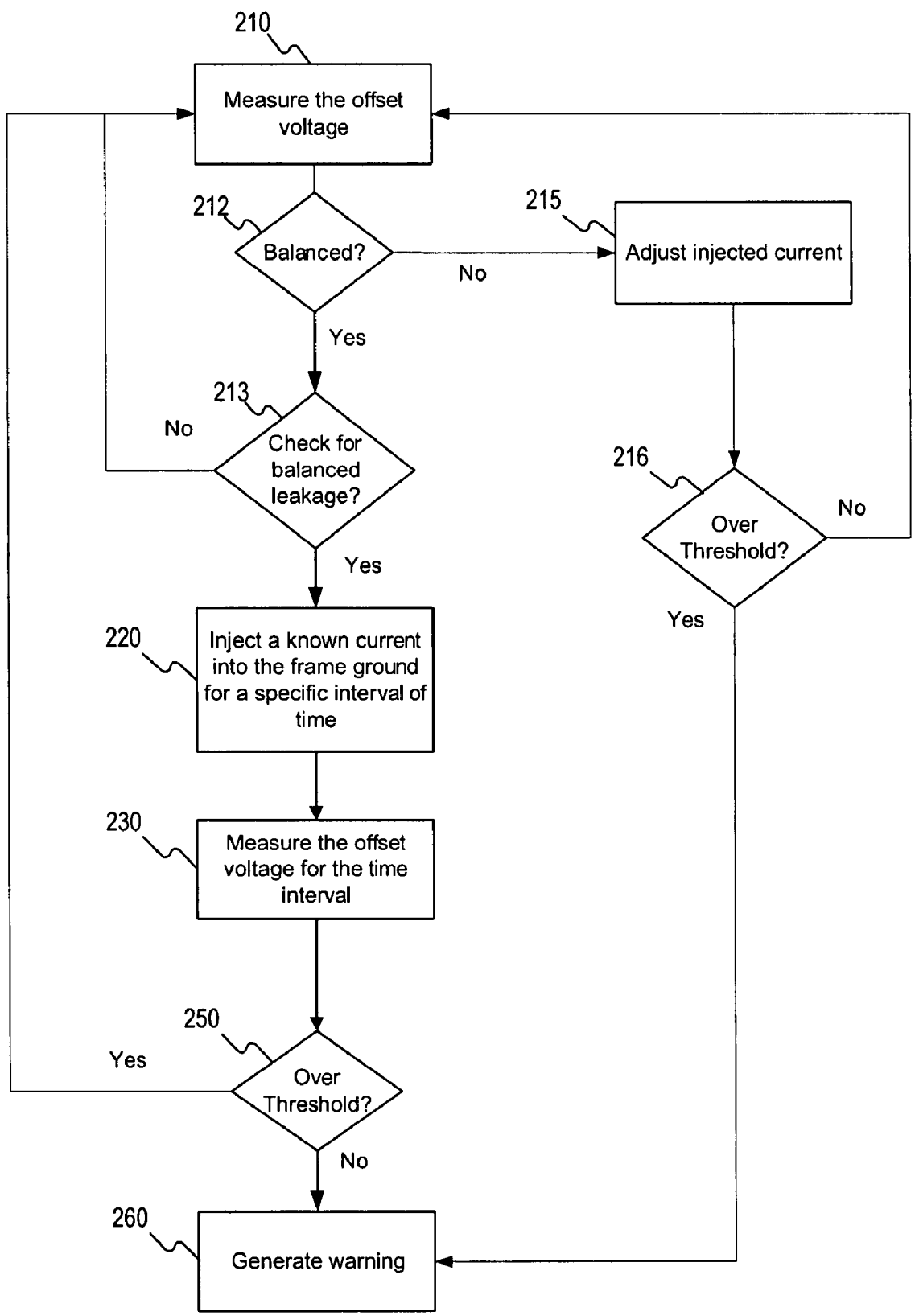
FIG. 2 is a flow chart of an exemplary process for detecting and compensating for electrical leakage consistent with the disclosed embodiments.

FIG. 2 illustrates an exemplary process for compensating and detecting electrical leakage consistent with the disclosed embodiments. To detect an undesired electrical leakage resistance in a balanced fault condition in circuit 100, leakage detection and compensation controller 30 may measure $V_{offset}$ to determine whether circuit 100 is in a balanced condition ($V_{offset}$=0 V) (step 210).

Depending on the specification of the machine hosting circuit 100 and the information related to components of circuit 100, leakage detection and compensation controller 30 may determine a balance threshold voltage (e.g., |BalanceThreshold|=5 V). When determining whether circuit 100 is in a balanced condition, leakage detection and compensation controller 30 may compare the predetermined balance threshold voltage to the $V_{offset}$ measurement (step 212). In one embodiment, if $V_{offset}$ is below the predetermined threshold (e.g., |$V_{offset}$|<5 V), leakage detection and compensation controller 30 may determine that the circuit is balanced. If $V_{offset}$ is over the threshold, leakage detection and compensation controller 30 may determine that circuit 100 is unbalanced. Leakage detection and compensation controller 30 may further determine that the unbalanced leakage currents should be compensated so that circuit 100 would be brought back to a balanced condition.

Further, leakage detection and compensation controller 30 may set a second warning threshold voltage. In one embodiment, when $V_{offset}$ is over the warning threshold (e.g., circuit 100 is severely unbalanced), leakage detection and compensation controller 30 may determine that circuit 100 may have severe faulty conditions and issue a warning signal/message accordingly.

If circuit 100 is unbalanced and $V_{offset}$ is below the warning threshold voltage, leakage detection and compensation controller 30 may control transistor switches SW1 and SW2 to balance circuit 100 by injecting compensating currents into circuit 100 (step 215). For example, when $V_{offset}$>5 V, circuit 100 has a significant leakage current between negative bus HV− and frame ground 20 (leakage current flowing though $R_{leak2}$), and HV+>|HV−|. To balance circuit 100, leakage detection and compensation controller 30 may apply control signal 1 to SW1, which initiates a current path between the positive voltage bus HV+ and frame ground 20 (compensating current $I_1$ flowing through resistor $R_5$). When transistor switch SW1 is conducting, capacitor $C_1$ becomes electrically coupled to resistor $R_5$. An electrical current path is established from one terminal of capacitor $C_1$ to transistor switch SW1. The other terminal of capacitor $C_1$ is connected to frame ground 20. Because one terminal of capacitor $C_1$ is connected to frame ground 20, and that the current $I_1$ flows into frame ground 20 through resistor $R_5$, capacitor $C_1$ would begin discharging exponentially with a time constant of RC, wherein C is the capacitance of $C_1$, and R is the resistance coupled with (e.g., the parallel configuration of resistors $R_1$ and $R_5$) capacitor $C_1$.

Additional circuit components may have a minor contribution to the RC time constant, such as, but not limited to, resistors $R_3$, $R_4$, and $R_6$. The contribution of such components is considered negligible in this example but may be considerable in another implementation and compensated for by leakage detection and compensation controller 30. After a specific time interval (determined by the RC constant), for example, 5 milliseconds, the voltage on capacitor $C_1$ may be sufficiently decreased so that circuit 100 may be balanced with both positive and negative voltage buses evenly charged with respect to ground frame 20.

Once circuit 100 is balanced, leakage detection and compensation controller 30 may re-measure offset voltage $V_{offset}$ to verify that circuit 100 is in a balanced condition (step 216). As explained earlier, when $V_{offset}$ is over a predetermined warning threshold (e.g., circuit 100 is severely unbalanced), leakage detection and compensation controller 30 may determine that circuit 100 may have severe faulty conditions and issue a warning signal/message accordingly (step 260).

Returning to step 212, in another embodiment, if leakage detection and compensation controller 30 determines that circuit 100 is balanced (e.g., |$V_{offset}$|<5 V), controller 30 may test the presence of balanced electrical leakage (step 213). To test whether there is balanced electrical leakage in the circuit, leakage detection and compensation controller 30 may inject a known current into circuit 100 for a specific time interval (step 220).

In one embodiment, circuit 100 is in a balanced condition, and the initial voltage $V_0$ on capacitor $C_1$ equals to HVDC/2. Leakage detection and compensation controller 30 may turn on transistor switch SW1 and inject current $I_1$. Current $I_1$ flows through resistor $R_5$ to frame ground 20. Capacitor $C_1$ is therefore discharged because one terminal of capacitor $C_1$ is connected to frame ground 20, which is charged by the established current path. The voltage across capacitor $C_1$ would drop exponentially over time t (i.e., $V(t)=V_0 e^{-t/RC}$) with a time constant of RC, wherein C is the capacitance of $C_1$ (and other capacitances between the HV+ and frame ground 20 and between HV− and frame ground 20), and R is the resistance coupled with capacitor $C_1$ (reflecting resistors $R_1$ and $R_5$).

After current $I_1$ is being injected into circuit 100 for a predetermined time interval, leakage detection and compensation controller 30 may measure $V_{offset}$ over the predetermined time interval (step 230). As shown in equation 2, $V_{offset}$ has a linear relationship to the voltage across capacitor $C_1$ (i.e., HV+). As such, the measurement of $V_{offset}$ over the time interval reflects the same RC constant of $V(t)$ as described above. Further, at the end of the predetermined time interval, $V_{offset}$ is measured and compared to the $V_{offset}$ measurement before the current $I_1$ was injected.

After measuring $V_{offset}$, leakage detection and compensation controller 30 may determine whether the change in $V_{offset}$ is less than a predetermined threshold value (step 250). When the change in $V_{offset}$ is over the threshold value, leakage and compensation controller 30 may start the leakage detection and compensation process again or upon request. When the change in $V_{offset}$ is less than the threshold value, leakage detection and compensation controller 30 may determine that the machine has faulty insulation or some other types of problems, and generate one or more types of warnings (step 260). In one embodiment, leakage detection and compensation controller 30 may transmit warnings to notify an operator of the machine via a display panel. For instance, upon detection of a leakage current, a display panel may display a message requesting that the machine be serviced.

A ground strap 325 (illustrated in FIG. 3) may be any type of strap or band of conductive material used to connect one or more components of an electrical casing to the frame ground of the machine or another electrical component. The ground strap 325 may be a separate conductor or part or a cable assembly such as a braided shield. The frame of the machine hosting the one or more components may be referred to as the frame ground. The metal casing of the component may be referred to as the local ground for the component. When the local ground of the component is properly connected to the machine frame ground by the ground strap 325, the local ground and the frame ground of the electric drive machine are at the same potential level.

When the ground strap 325 fails (e.g., a strap may fall off or become disconnected from the frame ground after an accident), the voltage difference between the local ground of the component and the frame ground may increase. Under certain conditions (e.g., when an electrical path is created between the local ground and the frame ground), such an increased voltage difference may cause damage to the machine and may cause a hazardous condition.

Figure 3:
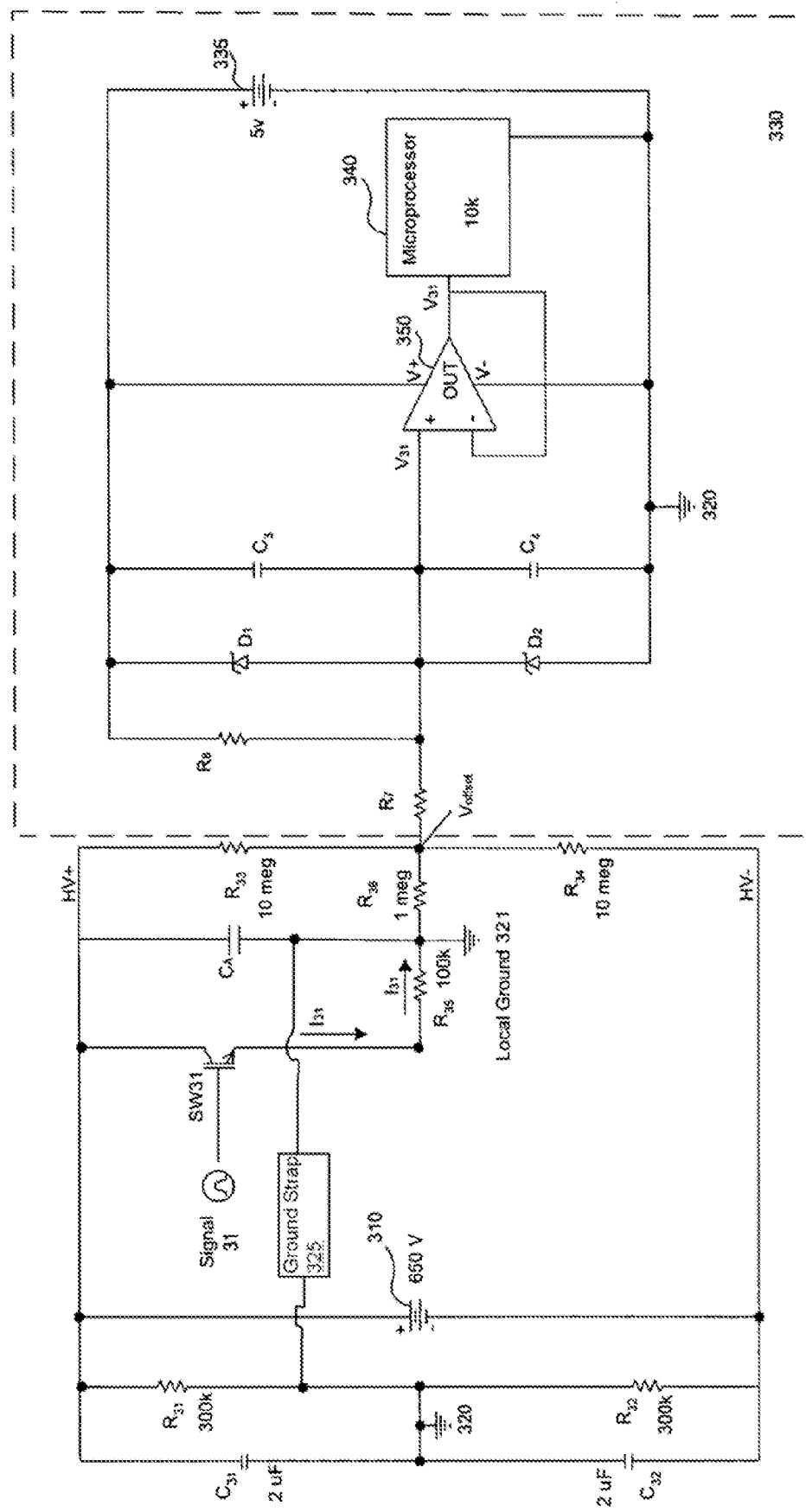
FIG. 3 is another exemplary electrical leakage detection and compensation circuit consistent with the disclosed embodiments.

Circuit 300, as shown in FIG. 3, may be used to ensure that a ground strap 325 is properly connected to the machine frame ground. The configuration of circuit 300 is similar to that of circuit 100 as shown in FIG. 1. Circuit 300 includes an HVDC power supply 310. HVDC power supply 310 may be a generator, a battery, or any other suitable power source.

The frame of the machine hosting circuit 300, including HVDC power supply 310, may be referred to as frame ground 320. Positive voltage bus HV+ is connected to the positive terminal of HVDC power supply 310. Negative voltage bus HV− is connected to the negative terminal of HVDC power supply 310. The positive and negative voltage buses (HV+ and HV−) are referenced to frame ground 320 by two resistors R.sub.31 and R.sub.32. Circuit 300 also includes a local ground 321. Local ground 321 refers to the local ground of a machine component. For example, the local ground of a machine component A (not shown) may be the metal casing of machine component A. A ground strap 325 connects local ground 321 to frame ground 320.

The frame of the machine hosting circuit 300, including HVDC power supply 310, may be referred to as frame ground 320. Positive voltage bus HV+ is connected to the positive terminal of HVDC power supply 310. Negative voltage bus HV− is connected to the negative terminal of HVDC power supply 310. The positive and negative voltage buses (HV+ and HV−) are referenced to frame ground 320 by two resistors $R_{31}$ and $R_{32}$. Circuit 300 also includes a local ground 321. Local ground 321 refers to the local ground of a machine component. For example, the local ground of a machine component A (not shown) may be the metal casing of machine component A. A ground strap (not shown) connects local ground 321 to frame ground 320.

Electrical leakage detection and compensation circuit 300 may also include one or more independent power supplies for supplying power to some of the circuit components. For example, a low voltage DC power supply may be a DC power supply that supplies voltage lower than that of HVDC power supply 310, such as a 5-V DC power supply 335, which supplies power to a microprocessor 340 and an operational amplifier (Op-Amp) 350.

Electrical leakage detection and compensation circuit 300 may further include a number of resistors and capacitors. $R_{31}$ and $R_{32}$ are two resistors of equal resistance that balance and reference the positive and negative voltage buses (HV+ and HV−) equally around frame ground 320. $C_3$, and $C_{32}$ are two capacitors of equal capacitance also used to balance and reference the voltage buses (HV+ and HV−) equally around frame ground 320. $C_A$ represents the capacitance of the machine component (e.g., component A) connected to local ground 321. Under normal conditions, $C_A$ is of a smaller value than that of capacitor $C_{31}$ or $C_{32}$. $R_{33}$ and $R_{34}$ are two resistors of equal resistance. Resistors $R_{33}$ and $R_{34}$ are connected to local ground 321 through resistor $R_{36}$. Resistors $R_{33}$, $R_{34}$, and $R_{36}$ form a voltage divider between the voltage buses (HV+ and HV−) and local ground 321. Resistor $R_{35}$ connects a transistor switch SW31 to local ground 321.

SW31, as shown in FIG. 3, is a transistor switch that may be turned ON and OFF by a control signal, such as control signal 31. Signal 31 may be an ON-OFF control signal generated by a leakage detection and compensation controller 330 (e.g., controlled by microprocessor 340). Leakage detection and compensation controller 330 may generate signals of predetermined or varying values (e.g., DC voltage levels, pulse width modulated signals, etc.).

Leakage detection and compensation controller 330 may be configured to detect the presence of an undesired electrical leakage current (i.e., an unacceptably low leakage resistance) between a terminal of HVDC power supply 310 and frame ground 320 of the machine containing HVDC power supply 310. Leakage detection and compensation controller 330 may include an Op-Amp 350 and a microprocessor 340 (e.g., PIC® 16F767 by Microchip Technology Inc.). Leakage detection and compensation controller 330 may further include one or more devices that measure voltage and/or current in a circuit. For example, a voltage measuring device may be configured to measure $V_{offset}$ in circuit 300.

Leakage detection and compensation controller 330 is configured to perform calculations that determine circuit unbalance, leakage resistances, leakage currents, etc. For example, leakage detection and compensation controller 330 may compare voltage $V_{31}$ to a predetermined value and determine whether to inject a current into circuit 300. Further, leakage detection and compensation controller 330 may be configured to control transistor switch SW31 based on the determination. Additionally, leakage detection and compensation controller 330 may provide data to other systems for further processing.

As explained earlier, in circuit 300, local ground 321 refers to the local ground of a machine component. The ground strap 325 connects local ground 321 to frame ground 320. When the ground strap 325 for machine component A is properly connected to frame ground 320, local ground 321 is at the same potential level as frame ground 320. When the ground strap 325 is not properly connected to frame ground 320, local ground 321 may be at a different potential level from that of frame ground 320.

As explained earlier, in circuit 300, local ground 321 refers to the local ground of a machine component. A ground strap connects local ground 321 to frame ground 320. When the ground strap for machine component A is properly connected to frame ground 320, local ground 321 is at the same potential level as frame ground 320. When the ground strap is not properly connected to frame ground 320, local ground 321 may be at a different potential level from that of frame ground 320.

If the ground strap 325 properly connects component A to frame ground 320 (i.e., local ground 321 is properly connected to frame ground 320), then C.sub.A and C.sub.31 are connected in parallel and injecting a small current for a short period of time, such as injecting current I.sub.31 of 5 mA for 10 milliseconds, would discharge the parallel combination of C.sub.A and C.sub.31 and V.sub.offset would change slowly. If, however, the ground strap 325 is not properly connecting component A to frame ground 320, then injecting the same current over the same time interval would not discharge C.sub.31; rather, C.sub.A only would be discharged and V.sub.offset would change much more quickly. The constraining design criteria is that C.sub.A not be so large that the existence of C.sub.31 is negligible.

If the ground strap properly connects component A to frame ground 320 (i.e., local ground 321 is properly connected to frame ground 320), then $C_A$ and $C_{31}$ are connected in parallel and injecting a small current for a short period of time, such as injecting current $I_{31}$ of 5 mA for 10 milliseconds, would discharge the parallel combination of $C_A$ and $C_{31}$ and $V_{offset}$ would change slowly. If, however, the ground strap is not properly connecting component A to frame ground 320, then injecting the same current over the same time interval would not discharge $C_{31}$; rather, $C_A$ only would be discharged and $V_{offset}$ would change much more quickly. The constraining design criteria is that $C_A$ not be so large that the existence of $C_{31}$ is negligible.

In one embodiment, leakage detection and compensation controller 330 may measure V.sub.offset before and after injecting a small current through transistor switch SW31 (e.g., injecting current I.sub.31 of 5 mA for 10 milliseconds) into the circuit. Leakage detection and compensation controller 330 may then determine the voltage difference (before and after injecting current I.sub.31) in the V.sub.offset measurements, and determine whether the corresponding change in the voltage across capacitor C.sub.31 is below a predetermined threshold value. If the voltage change is below the threshold value, leakage detection and compensation controller 330 may then determine that the ground strap 325 is properly connected to frame ground 320. Leakage detection and compensation controller 330 may repeat this process of testing the ground strap connection by injecting a small current and measuring V.sub.offset periodically or upon demand.

Referring back to FIG. 3, when the ground strap 325 is not properly connected to frame ground 320, capacitor $C_{31}$ may be disconnected from local ground 321, while machine component A (i.e., capacitance $C_A$) is still connected to local ground 321. The measurement of $V_{offset}$ would therefore reflect the voltage across the capacitance of machine component A (i.e., $C_A$). Under normal conditions, the capacitance of component A, $C_A$, is of a much smaller value than the capacitance of capacitor $C_{31}$. As such, injecting a small current for a short period of time, such as injecting 131 of 5 mA for 10 milliseconds, would discharge machine component A (i.e., $C_A$) by a large measure. The larger the capacitance of component A, $C_A$, with respect to the capacitance of rest of the system, $C_{31}$, the smaller the change in $V_{offset}$ when the ground strap 325 is not properly connected. $C_A$ may be larger than $C_{31}$, but must not be so large that the addition of $C_{31}$ in parallel to $C_A$ is negligible.

Further, $V_{offset}$ would reflect a second RC constant wherein C is the capacitance of machine component A (i.e., $C_A$) and R is the total resistance coupled with $C_A$ (resistors $R_{31}$, $R_{33}$, $R_{35}$, and $R_{36}$). As such, when the ground strap 325 is not properly connected to frame ground 320, the measurements of $V_{offset}$ would reflect that the second RC constant is much smaller than the first RC constant. The voltage across capacitance $C_A$ can be expressed as: $V(t)=V_0 e^{-t/RC}$. When the RC constant is smaller ($C_A$ will always be smaller than the parallel combination of $C_A$ and $C_{31}$), the voltage across $C_A$ would be discharged by a larger measure in a short period of time. Leakage detection and compensation controller 330 may therefore detect this faster voltage discharge in $V_{offset}$ measurements.

In one embodiment, leakage detection and compensation controller 330 may measure $V_{offset}$ before and after injecting a small current $I_{31}$ into the circuit. Leakage detection and compensation controller 330 may then verify that the voltage across $C_A$ has only been discharged by a large measure (e.g., by comparing it to a predetermined threshold value). Leakage detection and compensation controller 330 may further determine the second RC constant from the measurements of $V_{offset}$ and verify that the RC constant reflects the capacitance of $C_A$ and the resistance coupled with $C_A$. Based on detecting the significant voltage change across $C_A$ and the smaller RC constant, electrical leakage detection and compensation controller 330 may then determine that the ground strap 325 for machine component A is not properly connected to frame ground 320. Leakage detection and compensation controller 330 may further issue a warning signal for the faulty ground strap connection.

In one embodiment, leakage detection and compensation controller 330 may measure $V_{offset}$ before and after injecting a small current $I_{31}$ into the circuit. Leakage detection and compensation controller 330 may then verify that the voltage across $C_A$ has only been discharged by a large measure (e.g., by comparing it to a predetermined threshold value). Leakage detection and compensation controller 330 may further determine the second RC constant from the measurements of $V_{offset}$ and verify that the RC constant reflects the capacitance of $C_A$ and the resistance coupled with $C_A$. Based on detecting the significant voltage change across $C_A$ and the smaller RC constant, leakage detection and compensation controller 330 may then determine that the ground strap for machine component A is not properly connected to frame ground 320. Leakage detection and compensation controller 330 may further issue a warning signal for the faulty ground strap connection.

INDUSTRIAL APPLICABILITY

Methods and systems consistent with the disclosed embodiments may be implemented for leakage compensation in an electrical vehicle or a hybrid vehicle. Further, methods and systems consistent with the disclosed embodiments may be used for leakage compensation in any type of machine that requires an electrical power supply for its operations.

Methods and systems consistent with the disclosed embodiments may be implemented for leakage detection in an electrical vehicle or a hybrid vehicle. Further, methods and systems consistent with the disclosed embodiments may be used for leakage detection in any type of machine that requires an electrical power supply for its operations.

Systems and methods consistent with the disclosed embodiments may also be implemented within a machine having a data communication link to provide an error signal to a monitoring system detecting and/or indicating the severity of the fault condition caused by the leakage current. For example, when the circuit unbalance is over a threshold value, the monitoring system may determine that the machine has a faulty connection or some other type of problem. When circuit unbalance is detected, various levels of warnings may be generated to notify, for example, the operator of the machine via a display panel. For instance, upon detection of a circuit unbalance, a display panel may display a message requesting that the machine be serviced. Alternatively, remote warnings may be provided to entities or systems remotely connected to the machine.

In another example, when the balanced leakage current is over a threshold value, the monitoring system may determine that the machine has a faulty connection, faulty insulation, or some other type of problem. When leakage current is detected, various levels of warnings may be generated to notify, for example, the operator of the machine via a display panel or remotely located entities or systems. For instance, upon detection of a leakage current, a display panel may display a message requesting that the machine be serviced.

Systems and methods consistent with the disclosed embodiments may further be implemented within a machine to collect multiple sets of data over a period of time in order to analyze system faults based on the collected data. For example, the electrical leakage detection and compensation controller may switch the current sources in and out of a circuit multiple times over a defined time period. The electrical leakage detection and compensation controller may determine the circuit unbalance and leakage resistance each time. The electrical leakage detection and compensation controller may further analyze the pattern in the circuit unbalance and leakage resistance data. Based on this analysis, the electrical leakage detection and compensation controller may identify the electrical/mechanical component fault in the machine that implements circuit 100.

In one embodiment, the leakage detection and compensation controller may store patterns of circuit characteristics mapped to various machine conditions, such as a faulty wire connection. For example, the leakage detection and compensation controller may detect rapid toggles of voltage values from the (e.g., $V_{offset}$) measurements in a circuit (e.g., circuit 100). The leakage detection and compensation controller may compare this pattern of voltage toggles against those stored in its data storage. The leakage detection and compensation controller may thereby identify this voltage toggle pattern as one or more faulty wire connections in the machine. The voltage toggle patterns may also represent a typical or normal condition. For example, when a device or machine component is turned on, there may be a known leakage associated with it, and the new leakage becomes the normal condition for the machine. Therefore, the leakage detected may reflect a normal condition.

The implementation of the disclosed systems and methods are not limited to the circuits shown in FIGS. 1 and 3. It will be apparent to those skilled in the art that various modifications and variations of the disclosed embodiments can be made. Additionally, other embodiments of the disclosed methods and systems will be apparent to those skilled in the art from consideration of the specification. It is intended that the specification and examples be considered as exemplary only, with a true scope of the disclosure being indicated by the following claims.

What is claimed:

1. A ground strap connection detection system for a machine hosting an insulated high voltage system, comprising:
   a ground strap;
   an HVDC power supply electrically referenced to a machine frame ground through high impedance;
   a switch connected to the HVDC power supply and configured to control a current;
   a first resistor connected between a local ground and the switch;
   a voltage measuring device that measures an offset voltage between the local ground and a second resistor; and
   a leakage detection controller that determines whether the ground strap is properly connecting the local ground to the machine frame ground based on one or more offset voltage measurements.

2. The system of claim 1, wherein the leakage detection controller further controls the switch.

3. The system of claim 2, wherein the leakage detection controller further injects a predetermined current using the switch.

4. The system of claim 3, wherein the leakage detection controller further determines whether the ground strap is properly connected based on an RC constant related to the high voltage system.

5. A ground strap connection detection system for a machine hosting an insulated high voltage system, comprising:
   a ground strap;
   an HVDC power supply electrically referenced to a machine frame ground through high impedance;
   a switch connected to the HVDC power supply and configured to control a current;
   a resistor connected between a local ground and the switch;
   a voltage measuring device that measures an offset voltage between the local ground and a second resistor reflecting whether the high voltage system is in an unbalanced fault condition; and
   a leakage detection controller that determines a balanced leakage resistance and a balanced leakage current of the machine based on a change in measured offset voltage when a known current is injected into the high voltage system, wherein the leakage detection controller further determines whether the ground strap is properly connecting the local ground to the machine frame ground.

6. The system of claim 5, wherein the leakage detection controller determines the balanced leakage resistance by injecting a known current into the high voltage system.

7. The system of claim 6, wherein the leakage detection controller further injects the known current for a time interval using the switch.

8. The system of claim 7, wherein the leakage detection controller measures the offset voltage before and after the time interval.

9. The system of claim 8, wherein the leakage detection controller further determines an RC constant based on one or more offset voltage measurements over the time interval.

10. The system of claim 9, wherein the leakage detection controller further determines whether the ground strap is properly connected based on the RC constant.

11. A method for detecting a faulty ground strap connection in a machine including a high voltage system, a ground strap connecting a local ground to a machine frame ground, the method including:
    measuring a first offset voltage in the high voltage system;
    injecting a current into a resistor connected to the local ground for a time interval;
    measuring a second offset voltage after injecting the current for the time interval; and
    determining whether the ground strap is properly connecting the local ground to the frame ground based on the first and the second offset voltage measurements.

12. The method of claim 11, further including:
    interposing a voltage divider between a positive voltage side of an HVDC power supply, a negative voltage side of the HVDC power supply, and the frame ground; and
    measuring the first and second offset voltages across a resistor of the voltage divider.

13. The method of claim 11, further including:
    determining whether the first offset voltage is over a threshold value; and
    outputting a warning signal if the first offset voltage is over the threshold value.

14. The method of claim 11, further including:
    measuring the offset voltage continuously during the time interval.

15. The method of claim 14, further including:
    determining an RC constant based on the continuous offset voltage measurement; and
    determining whether the ground strap is properly connected to the frame ground based on the RC constant.

16. The method of claim 15, further including:
    determining whether a change in the offset voltage measurements before and after the time interval is below a threshold value.

17. The method of claim 16, further including:
    outputting a warning signal if the change in the offset voltage measurements is below the threshold value.

18. A method for detecting a faulty ground strap connection between a frame ground and a machine component of a machine, wherein the machine includes a high voltage system, the method comprising:
    taking a first offset voltage measurement in the high voltage system;
    determining whether the high voltage system is balanced in reference to the frame ground based on the first offset voltage measurement;
    injecting a first current into the high voltage system for a time interval after determining that the high voltage system is balanced;
    taking one or more offset voltage measurements during the time interval; and determining whether there is a faulty ground strap connection between the frame ground and the machine component based on the offset voltage measurements.

19. The method of claim 18, further comprising:
determining whether there is a faulty ground strap connection based on an RC constant related to the high voltage system.

20. The method of claim 18, further comprising:
determining the RC constant based on one or more offset voltage measurements taken over the time interval.

* * * * *